United States Patent [19]
Hibbs et al.

[11] Patent Number: 6,110,624
[45] Date of Patent: Aug. 29, 2000

[54] MULTIPLE POLARITY MASK EXPOSURE METHOD

[75] Inventors: Michael S. Hibbs, Westford; Timothy E. Neary, Essex Junction; David S. O'Grady, Jericho; Denis M. Rigaill, South Burlington, all of Vt.

[73] Assignee: International Business Machines Corporation, Armonk, N.Y.

[21] Appl. No.: 09/225,114

[22] Filed: Jan. 4, 1999

[51] Int. Cl.⁷ .................................. G03F 9/00; G03C 5/00
[52] U.S. Cl. .................................................. 430/5; 430/394
[58] Field of Search .............................. 430/5, 322, 323, 430/324, 394, 396

[56] References Cited

U.S. PATENT DOCUMENTS

| | | | |
|---|---|---|---|
| 5,338,626 | 8/1994 | Garofalo et al. | 430/5 |
| 5,476,753 | 12/1995 | Hashimoto et al. | 430/296 |
| 5,576,122 | 11/1996 | Ham | 430/5 |
| 5,582,939 | 12/1996 | Pierrat | 430/5 |
| 5,776,660 | 7/1998 | Hakey et al. | 430/296 |

OTHER PUBLICATIONS

IBM Technical Disclosure Bulletin, Portable Intimately Contacted Mask, Lin, B.J., vol. 21, No. 5, Oct. 1978.

Moreau, Wayne, M., Semiconductor Lithography Principles, Practices, and Materials, 1998, Plenum Press, pp. 253, 320, 321, 584–587, 589.

*Primary Examiner*—S. Rosasco
*Attorney, Agent, or Firm*—McGinn & Gibb, P.C.; Howard J. Walter, Jr.

[57] ABSTRACT

A patterned mask and method of forming a patterned mask over a substrate, comprising forming a first resist layer over the substrate, forming a second resist layer over the first resist layer, patterning the first resist using energy selective to the first resist layer to form a first patterned resist, and patterning the second resist using energy selective to the second resist layer to form a second patterned resist, wherein the first patterned resist and the second patterned resist form the patterned mask.

39 Claims, 3 Drawing Sheets

MULTIPLE POLARITY MASK EXPOSURE METHOD

BACKGROUND OF THE INVENTION

1. Field of the Invention

The present invention generally relates to the formation of patterns on semiconductor substrates and more specifically to a method of forming masks, such as chrome masks on quartz, with a reduced defect rate.

2. Description of the Related Art

Conventional systems utilize positive tone resist materials, including, but not limited to, high polymer organic films or negative resists materials including, but not limited to, high polymer organic films. A pattern is exposed on the positive or negative resists using an electromagnetic source, such as a laser beam or electron beam. When the positive resist is developed the exposed portions become soluble and are removed with a solution such as an alkaline or solvent solution. Similarly, when the negative resist is developed the unexposed portions become soluble and are removed with a solution such as an alkaline or solvent solution. Therefore, as is well known to those ordinarily skilled and the art, a positive or negative image of a pattern can be formed in a resist according to most design requirements.

However, opaque defects sometimes occur when patterning and exposing the negative resist when foreign material resides within the resist film or foreign material remains on the substrate after processing. Similarly, clear defects sometimes occur when forming the positive resist when foreign material resides on or in the resist film or a concentrated develop chemical attacks the resist.

Such defects result in improperly formed or etched patterns. For example, if the resist is used as a protective mask in an etching process, the clear or opaque defect would cause, respectively, too much or too little etching of the underlying layer of material to be patterned.

For example, as shown in FIG. 1, a linear edge 10, 11, 12 was intended to be formed. However, a defect 13 caused the linear edge to deviate from the intended line 12. Such a defect is considered repairable because the portions of the edge 11 and 10 can be easily connected (e.g., extended) to formed the missing line 12.

FIG. 2 illustrates non-repairable defects. More specifically, an area 21 of a pattern 20 and an edge 22 of a pattern 23 were not properly formed. The areas 21 and 22 should have been completed along the dotted lines shown in FIG. 2. These defects are non-repairable because, without knowing the dotted line patterns 21 and 22, it is not possible to accurately estimate the shape of the complete patterns 20 and 23. For example, one possible repair of the missing patterns would incorrectly connect patterns 23 and 20 along straight lines beginning in the opening in pattern 23.

If a defect is repairable, the pattern is copied from adjacent fields using the adjacent fields as a template. However, if the defect is non-repairable, such as that shown in FIG. 2, the item being manufactured will need to be scrapped or the entire pattern reworked, which substantially decreases production efficiency.

The invention described below substantially reduces the possibility of non-repairable defects and, therefore, dramatically increases production efficiency, lowers costs and increases reliability.

SUMMARY OF THE INVENTION

The invention comprises a patterned mask and method of forming a patterned mask over a substrate, including forming a first resist layer over the substrate, forming a second resist layer over the first resist layer, patterning the first resist using energy selective to the first resist layer to form a first patterned resist, and patterning the second resist using energy selective to the second resist layer to form a second patterned resist. The first patterned resist and the second patterned resist form the patterned mask.

The forming the first resist comprises forming a negative resist and the forming the second resist comprises forming a positive resist. The patterning of the first resist comprises selectively applying an electron beam to the first resist and the patterning of the second resist comprises selectively applying a laser beam to the second resist.

The patterning of the first resist comprises a first patterning resolution and the patterning of the second resist comprises a second patterning resolution, less than that of the first patterning resolution. The patterning of the first resist has a first defect rate and the patterning of the second resist has a second defect rate less than that of the first defect rate.

The patterning of the second resist includes biasing the second resist with respect to the first resist such that the first resist substantially forms an outline of the mask and the second resist forms only portions of the mask where defects exist in the first resist. By simultaneously utilizing resists having different polarities, the invention minimizes the disadvantages of each resist alone and combines the advantages of each resist.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 3:
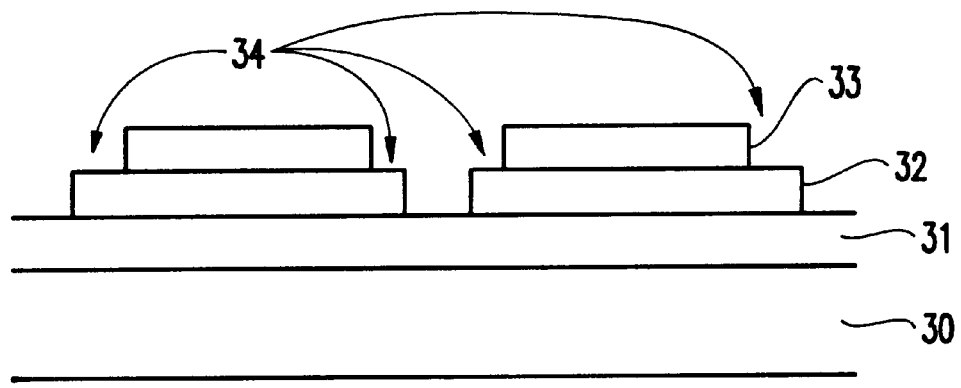
FIG. 3 is a schematic diagram of a combination positive and negative resist formed according to the invention.

Referring now to the drawings, and more particularly to FIG. 3, a first embodiment of the invention is illustrated. More specifically, FIG. 3 illustrates a substrate 30 (such as a quartz layer), a second layer 31 (such as a chrome layer) which is to be patterned, a first resist layer 32 such as a negative resist layer and a second resist layer 33 which has an opposite polarity when compared to the first resist layer 32, such as a positive resist material. In the example shown in FIG. 3, the first and second resists 32, 33 will be used as a mask to etch the second layer 31.

The substrate 30, second layer 31, first resist 32 and second resist 33 can be formed using techniques well known to those ordinarily skilled in the art. For example, if the substrate 30 is a quartz layer, the quartz can be formed by cutting and polishing a quartz ignote. Similarly, if the second layer 31 is a chrome layer, it can be formed by spluttering, chemical vapor deposition, plasma enhanced chemical vapor deposition, and other similar techniques.

If the first resist layer 32 is a negative resist, it may comprise, for example, high polymer organics (Shipley XP 8943, Shipley Company 100 Independence Mall West, Philadelphia, Pa. 19106-2399) and can be formed by dispense and spin-coating. Similarly if the second resist layer of 33 is a positive resist, it may comprise, for example, high polymer organics (OCG 895i) manufactured by OCG (OCG Microelectronic Materials, 501 Merrit 7, Norwalk, Conn. 06856) and may be formed by dispense and spin-coating.

The first resist layer 32 is deposited on the second layer 31. Subsequently, the second resist layer 33 is formed over the first resist layer 42.

More specifically, the first resist layer 32 is exposed using an exposure source which does not affect the second resist 33. Similarly, the second resist is exposed using an exposure source which does not affect the first resist 32. Both resists can be exposed from the same direction.

For example, if the first resist 32 is electron beam sensitive, it can be exposed with an electron beam, using, for example, an Etec 4500 e-beam generator, manufactured by ETEC Systems Inc., 26460 Corporation Avenue, in Hayward, Calif. 94545, USA or any other similarly available electron generator. The chrome layer 31 discharges the electron beam electrons. Similarly, if the positive resist is photosensitive it can be exposed with a laser exposure system such as, CORE or ALTA laser exposure system manufactured by ETEC systems, Inc. which does not affect the negative resist 32.

Figure 4A:
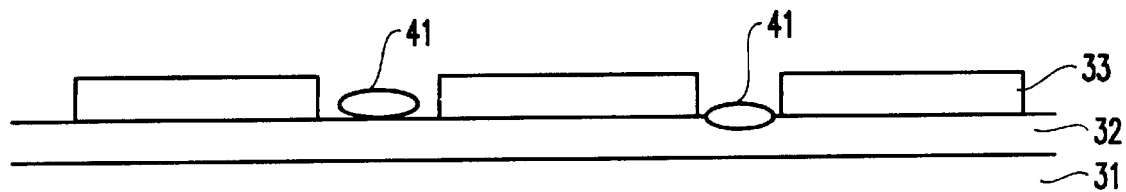
FIGS. 4A–4B are schematic diagrams illustrating the manner in which the inventive positive and negative resist overcomes the problem of opaque defects.

The negative resist 32 is very useful for etching the underlying layer 31 because the electron beam produces a mask which has a very high resolution. Therefore, the presence of the negative resist 32 enhances, for example, the dry etching of the underlying chrome 31. However, the negative resist has elevated defect levels. For example, as shown in FIG. 4A, opaque defects often occur when exposing the negative resist 32.

To the contrary, the positive resist 33 generally suffers from substantially less defects during exposure than the negative resist 32. However, the light beam generated by the laser writer generally does not have as high a resolution as the electron beam used to pattern the negative resist 32. This is true especially with respect to small images and small patterns (e.g., 500 nm features).

The invention combines the benefit of increased resolution associated with the first resist 32 and the benefit of lower defects associated with the second resist 33 by forming the second resist 33 to have a bias 34 with respect to the first resist 32. The bias 34 is created by forming the second resist 33 with smaller dimensions than the first resist the 32. Since the first resist 32 covers more area than the second resist 33, the first resist 42 will control the shape of the overall mask formed by the combination of the two resists 32, 33. The second resist 33 reduces the number of defects in the overall mask and provides a continuous mask, even if portions of the negative resist 32 are defective.

Thus, with the invention, the first "higher resolution" resist 32 will control the general pattern of the overall mask 32, 33 and the second "lower defect" resist 33 provides a continuous (although somewhat less exact) mask in areas which would otherwise be missing mask material if the first resist 32 were defective.

If a portion of the overall mask formed only with the second resist 33 has insufficient resolution it mays not form properly sized features. However, these types of defects (e.g., improper size) are much more easily repairable than the defects associated with missing portions of the first resist 32 alone.

Figure 1:
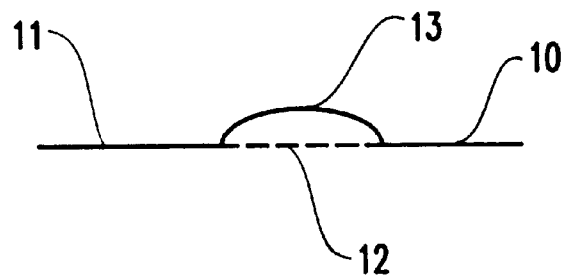
FIG. 1 is a schematic diagram of a repairable defect.
Figure 2:
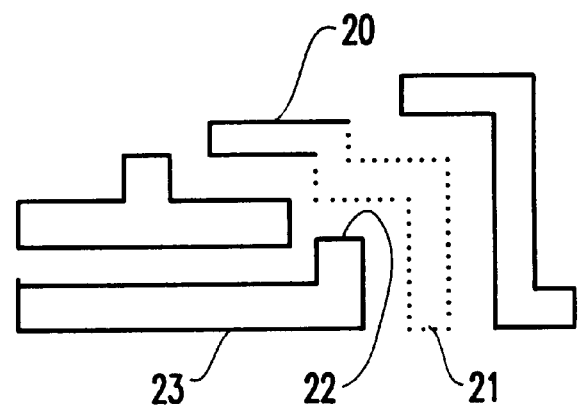
FIG. 2 is a schematic diagram of non-repairable defects.

As shown in FIG. 2, many defects in the first resist 32 are not repairable because the defect supplies no information regarding the shape of the proper pattern. However, since the invention supplies at least the second resist 33 over defects of the first resist 32, the missing pattern (or reduced pattern) of a defect area can be known with greater certainty, which makes successful repairs substantially more likely.

Figure 6:
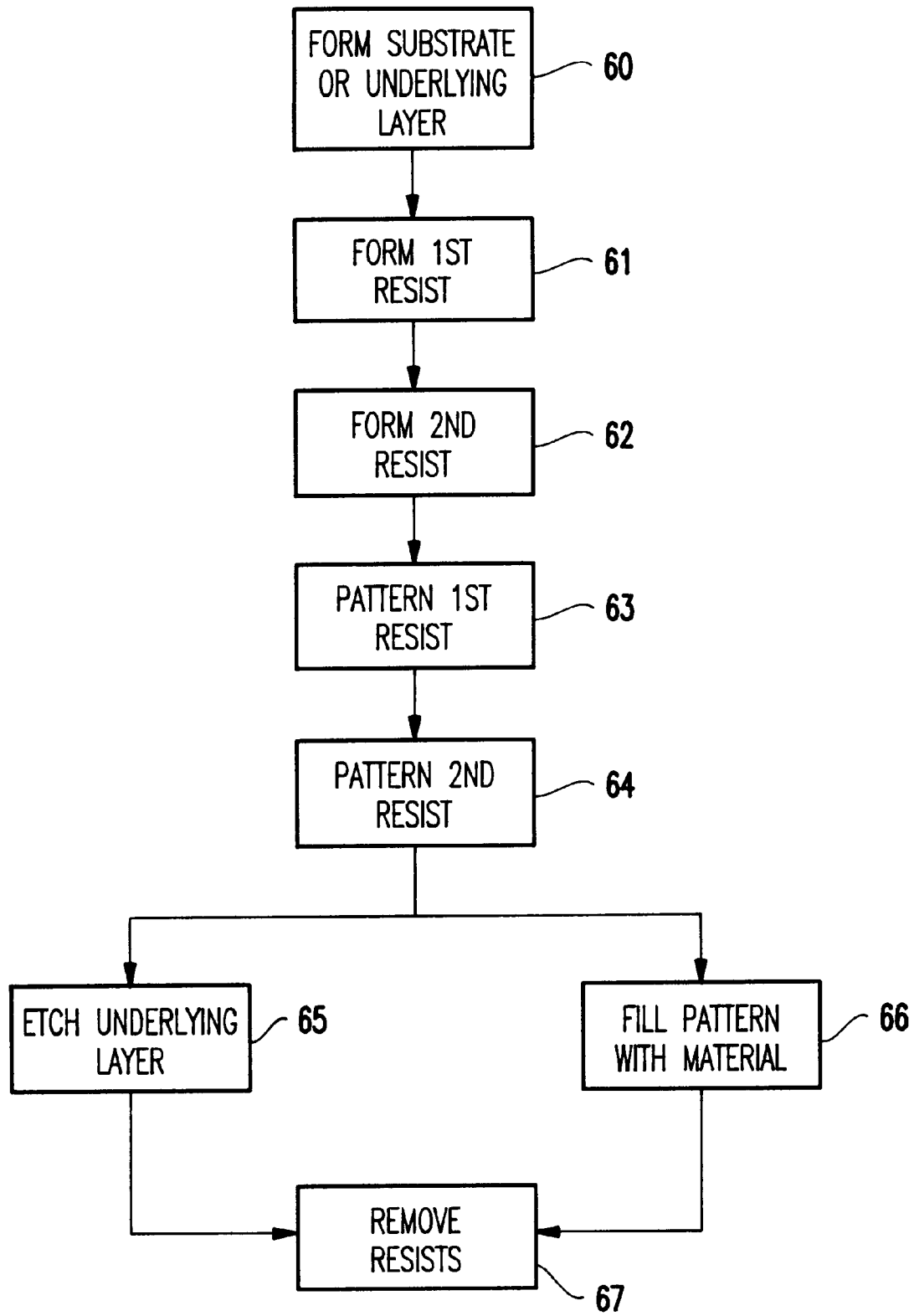
FIG. 6 is a flowchart illustrating a preferred method of the invention.

An exemplary method for utilizing the invention is shown in the flowchart in FIG. 6. More specifically, in block 60, the method includes forming the substrate or underlying layer 31. The first resist 32 and the second resist 33 are respectively formed, as shown in blocks 61 and 62. The resists are then patterned in blocks 63 and 64.

As mentioned above, the electron beam used to pattern the negative resist 32 does not affect the positive resist 33 and the laser patterning of the positive resist 33 does not affect the negative resist 32. Therefore, the order of forming the first and second resists 32, 33 and of patterning (e.g., exposing and developing) the first and second resists 32, 33 can be changed without substantially affecting the invention. For example, the first resist 32 could be formed and patterned and then the second resist 33 could be formed and patterned. Alternatively, the two resists could be sequentially formed and patterned in any order, depending upon in the manufacturing environment requirements.

As shown in blocks 65 and 66, the first and second resists 32, 33 can be used as a mask in any form of standard processing, such as using the resists as a protective mask to etch the underlying layer to 31 (block 65). Alternatively, the pattern formed with the resists 32, 33 can be filled with a material, such as a conductive material to form a wiring pattern (block 66). Once the resists 32, 33 have served their useful function, they can be removed as shown in block 67.

As mentioned above, conventional systems utilize either a negative resist or a positive resist. Thus, conventionally, each different type of resist was evaluated (and its limitations considered) to determine which resist would be most suitable for the project at hand. However, with the invention, by simultaneously utilizing both positive and negative resists, the benefits of both resists can be seen, while the disadvantages of each resist are avoided (e.g., each resist compensates for the other).

Figure 4B:
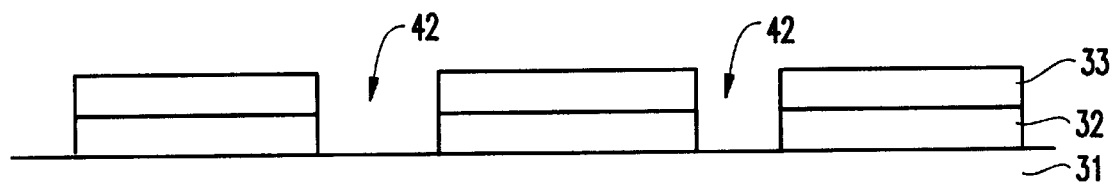

For example, as shown in FIG. 4B, the use of the positive resist eliminates the opaque defects by the tendency of defects to rinse away during the removal of the unexposed negative first resist film beneath the opaque defects.

Figure 5A:
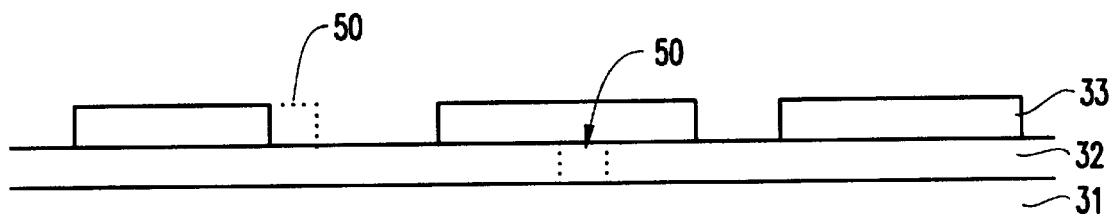
FIGS. 5A–5B are schematic diagrams illustrating the manner in which the inventive positive and negative resist overcomes the problem of clear defects.
Figure 5B:
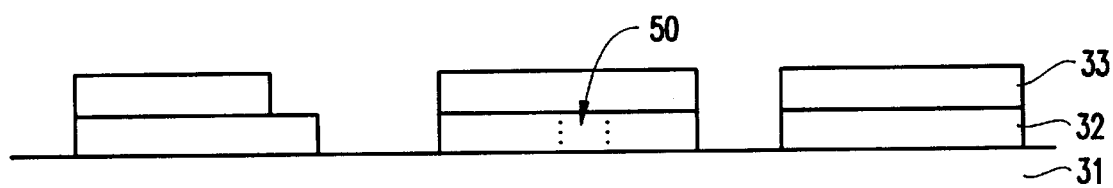

A second example of the advantages produced by the invention are shown in FIGS. 5A and 5B. As mentioned in the background section, clear defects 50 often occur in the positive and negative resists 32, 33. However, with the inventive structure such clear defects are not translated to the underlying chrome 31 because each of the resists 32, 33 protect the underlying chrome layer 32 from the etching process and clear defects are not likely to appear in the same location in both resists 32, 33. Thus, the presence of only one of the two resists 32, 33 will overcome a clear defect 50 in the other resist.

While the invention is described above with respect to a protective etching mask for a chrome layer overlying a quartz substrate, as would be known by one ordinarily skilled in the art given this disclosure, the invention is equally applicable to any type of manufacturing process which utilizes resists, including but not limited to semiconductor wafer fabrication, flat-panel display fabrication or circuit interconnect substrate fabrication.

By simultaneously utilizing resists having different polarities, the invention minimizes the disadvantages of each resist alone and combines the advantages of each resist.

The invention brings the benefit of allowing the mask exposure to be portioned between two different exposure systems. For example, large images could be only exposed by a laser exposure system and small features exposed by both laser and electron beam systems. This would reduce the required exposure duration for the electron beam system.

While the invention has been described in terms of preferred embodiments, those skilled in the art will recognize that the invention can be practiced with modification within the spirit and scope of the appended claims.

What is claimed is:

1. A method of forming a patterned mask over a substrate comprising:

forming a first resist layer over said substrate;

forming a second resist layer over said first resist layer;

exposing said first resist using energy selective to said first resist layer to form a first patterned resist; and exposing said second resist using energy selective to said second resist layer to form a second patterned resist, wherein said first patterned resist and said second patterned resist comprise said patterned mask.

2. The method in claim 1, wherein said forming said first resist comprises forming a negative resist and said forming of said second resist comprises forming a positive resist.

3. The method in claim 1, wherein said exposing of said first resist comprises selectively applying an electron beam to said first resist and said exposing of said second resist comprises selectively applying a laser beam to said second resist.

4. The method in claim 1, wherein said exposing of said first resist comprises a first resolution and said exposing of said second resist comprises a second resolution, less than that of said first patterning resolution.

5. The method in claim 1, wherein said exposing of said first resist has a first defect rate and said exposing of said second resist has a second defect rate less than that of said first defect rate.

6. The method in claim 1, wherein said exposing of said second resist includes biasing said second resist with respect to said first resist such that said first resist substantially forms an outline of said mask and said second resist only forms portions of said outline of said mask where defects exist in said first resist.

7. The method in claim 1, wherein said first resist and said second resist are exposed from a same direction.

8. The method in claim 1, wherein said first resist is unaffected by an exposure source used to expose said second resist and said second resist is unaffected by an exposure source used to expose said first resist.

9. The method in claim 1, wherein said exposing of said first resist comprises exposing a first pattern and said exposing of said second resist comprises exposing a second pattern, and wherein said second pattern is a same pattern as said first pattern and is biased with respect to said first pattern.

10. The method in claim 9, wherein said first pattern has smaller dimensions than said second pattern.

11. A method of forming a semiconductor structure having patterned layers, said method comprising:

forming a first resist layer;

forming a second resist layer over said first resist layer;

exposing said first resist using energy selective to said first resist layer to form a first patterned resist;

exposing said second resist using energy selective to said second resist layer to form a second patterned resist, wherein said first patterned resist and said second patterned resist comprise said patterned mask; and using said patterned mask to pattern a layer of said semiconductor structure.

12. The method in claim 11, wherein said forming said first resist comprises forming a negative resist and said forming of said second resist comprises forming a positive resist.

13. The method in claim 11, wherein said patterning of said first resist comprises selectively applying an electron beam to said first resist and said exposing of said second resist comprises selectively applying a laser beam to said second resist.

14. The method in claim 11, wherein said exposing of said first resist comprises a first resolution and said exposing of said second resist comprises a second resolution, less than that of said first patterning resolution.

15. The method in claim 11, wherein said exposing of said first resist has a first defect rate and said exposing of said second resist has a second defect rate less than that of said first defect rate.

16. The method in claim 11, wherein said exposing of said second resist includes biasing said second resist with respect to said first resist such that said first resist substantially forms an outline of said mask and said second resist only forms portions of said outline of said mask where defects exist in said first resist.

17. The method in claim 11, wherein said first resist and said second resist are exposed from a same direction.

18. The method in claim 11, wherein said first resist is unaffected by an exposure source used to expose said second resist and said second resist is unaffected by an exposure source used to expose said first resist.

19. The method in claim 11, wherein said exposing of said first resist comprises exposing a first pattern and said exposing of said second resist comprises exposing a second pattern, and wherein said second pattern is a same pattern as said first pattern and is biased with respect to said first pattern.

20. The method in claim 19, wherein said first pattern has smaller dimensions than said second pattern.

21. A method of forming a patterned chrome layer over a quartz substrate comprising:

forming a chrome layer over a quartz substrate;

forming a first resist layer over said chrome layer;

forming a second resist layer over said first resist layer;

exposing said first resist using energy selective to said first resist layer to form a first patterned resist; and exposing said second resist using energy selective to said second resist layer to form a second patterned resist, wherein said first patterned mask and said second patterned mask comprise said patterned mask; and patterning said chrome layer using said patterned mask.

22. The method in claim 21, wherein said forming said first resist comprises forming a negative resist and said forming of said second resist comprises forming a positive resist.

23. The method in claim 21, wherein said exposing of said first resist comprises selectively applying an electron beam to said first resist and said exposing of said second resist comprises selectively applying a laser beam to said second resist.

24. The method in claim 21, wherein said exposing of said first resist comprises a first resolution and said exposing of said second resist comprises a second resolution, less than that of said first patterning resolution.

25. The method in claim 21, wherein said exposing of said first resist has a first defect rate and said exposing of said second resist has a second defect rate less than that of said first defect rate.

26. The method in claim 21, wherein said exposing of said second resist includes biasing said second resist with respect to said first resist such that said first resist substantially forms an outline of said mask and said second resist only forms portions of said outline of said mask where defects exist in said first resist.

27. The method in claim 21, wherein said first resist and said second resist are exposed from a same direction.

28. The method in claim 21, wherein said first resist is unaffected by an exposure source used to expose said second resist and said second resist is unaffected by an exposure source used to expose said first resist.

29. The method in claim 21, wherein said exposing of said first resist comprises exposing a first pattern and said exposing of said second resist comprises exposing a second pattern, and wherein said second pattern is a same pattern as said first pattern and is biased with respect to said first pattern.

30. The method in claim 29, wherein said first pattern has smaller dimensions than said second pattern.

31. A patterned mask for forming patterns on a substrate, said patterned mask comprising:
 a first resist layer over said substrate; and
 a second resist layer over said first resist layer, wherein said first resist is responsive to a first exposure source and said second resist is responsive to a second exposure source.

32. The patterned mask in claim 31, wherein said first resist comprises a negative resist and said second resist comprises a positive resist.

33. The patterned mask in claim 31, wherein said first resist has a first resolution and said second resist has a second resolution, less than that of said first patterning resolution.

34. The patterned mask in claim 31, wherein said first resist has a first defect rate and said second resist has a second defect rate less than that of said first defect rate.

35. The patterned mask in claim 31, wherein said second resist is biased with respect to said first resist such that said first resist substantially forms an outline of said mask and said second resist forms only portions of said mask where defects exist in said first resist.

36. The patterned mask in claim 31, wherein said first resist and said second resist are exposed from a same direction.

37. The patterned mask in claim 31, wherein said first resist is unaffected by an exposure source used to expose said second resist and said second resist is unaffected by an exposure source used to expose said first resist.

38. The patterned mask in claim 31, wherein said first resist has a first pattern and said second resist has a second pattern, and wherein said second pattern is a same pattern as said first pattern and is biased with respect to said first pattern.

39. The patterned mask in claim 38, wherein said first pattern has smaller dimensions than said second pattern.

* * * * *